(12) United States Patent
Hocker et al.

(10) Patent No.: US 10,952,355 B1
(45) Date of Patent: Mar. 16, 2021

(54) APPARATUS, SYSTEM, AND METHOD FOR ELECTROMAGNETIC INTERFERENCE MITIGATION IN OPTICAL MODULE CAGES

(71) Applicant: Juniper Networks, inc., Sunnyvale, CA (US)

(72) Inventors: Keith Hocker, Sunnyvale, CA (US); Philippe C. Sochoux, Sunnyvale, CA (US); Qian Liu, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 16/655,142

(22) Filed: Oct. 16, 2019

(51) Int. Cl.
*H05K 9/00* (2006.01)
*H04B 10/40* (2013.01)
*H05K 5/02* (2006.01)

(52) U.S. Cl.
CPC .......... *H05K 9/0024* (2013.01); *H04B 10/40* (2013.01); *H05K 5/0247* (2013.01)

(58) Field of Classification Search
USPC .......................................... 361/799, 816, 818
See application file for complete search history.

(56) References Cited

U.S. PATENT DOCUMENTS

| 5,879,173 | A   | * | 3/1999  | Poplawski | G02B 6/4246 439/138 |
|-----------|-----|---|---------|-----------|---------------------|
| 6,893,293 | B2  | * | 5/2005  | Ice       | G02B 6/4277 439/607.2 |
| 7,136,008 | B2  | * | 11/2006 | Aisenbrey | B29C 70/58 342/4 |
| 8,714,839 | B2  | * | 5/2014  | Ito       | H05K 9/0018 385/139 |
| 8,870,471 | B2  | * | 10/2014 | Ito       | G02B 6/4277 385/88 |
| 9,882,297 | B2  | * | 1/2018  | Regnier   | H01R 24/30 |
| 2003/0117787 | A1 | * | 6/2003 | Nakauchi  | H05K 1/0218 361/818 |
| 2003/0171033 | A1 | * | 9/2003 | Bright    | G02B 6/4277 439/607.25 |
| 2018/0228063 | A1 | * | 8/2018 | Dixon     | H05K 1/0203 |

* cited by examiner

*Primary Examiner* — Hung S. Bui
(74) *Attorney, Agent, or Firm* — FisherBroyles, LLP

(57) ABSTRACT

The disclosed apparatus may include (1) a cage designed to house an optical transceiver module, wherein the cage includes (A) an entry side that forms an opening for installation and removal of the optical transceiver module and (B) a back side opposite the entry side and (2) an EMI absorber coupled to the back side of the cage to limit an amount of radiated energy that escapes the cage during operation of the optical transceiver module. Various other apparatuses, systems, and methods are also disclosed.

10 Claims, 8 Drawing Sheets

APPARATUS, SYSTEM, AND METHOD FOR ELECTROMAGNETIC INTERFERENCE MITIGATION IN OPTICAL MODULE CAGES

Network devices (such as routers) often include optical transceiver modules that facilitate communication with other devices within a network and/or across networks. For example, a router may include a row of 6 optical transceiver modules that collectively facilitate communication with various other routers within a network. During operation, these optical transceiver modules may generate a significant amount of electromagnetic noise. Unfortunately, such electromagnetic noise may interfere with and/or inhibit the performance of the surrounding optical transceiver modules, other components within the router, and/or nearby computing devices.

Moreover, governmental regulatory bodies may implement regulations that limit the amount of electromagnetic radiation that these optical transceiver modules are allowed to emit. For example, regulations in the United States of America may limit the amount of electromagnetic radiation emitted by such optical transceiver modules to 60 decibels referenced to 1 microvolt per meter (dBuV/m) between 960 MHz to 40 GHz. Unfortunately, as this technology advances and its performance improves, the optical transceiver modules may generate greater amounts of electromagnetic radiation, potentially approaching and/or exceeding such regulatory limits.

The instant disclosure, therefore, identifies and addresses a need for additional and improved apparatuses, systems, and methods for Electromagnetic Interference (EMI) mitigation in optical module cages.

SUMMARY

As will be described in greater detail below, the instant disclosure generally relates to apparatuses, systems, and methods for EMI mitigation in optical module cages. In one example, an apparatus for accomplishing such a task may include (1) a cage designed to house an optical transceiver module, wherein the cage includes (A) an entry side that forms an opening for installation and removal of the optical transceiver module and (B) a back side opposite the entry side and (2) an EMI absorber coupled to the back side of the cage to limit an amount of radiated energy that escapes the cage during operation of the optical transceiver module.

Similarly, a system for accomplishing such a task may include (1) a circuit board, (2) a cage coupled to the circuit board and designed to house an optical transceiver module, wherein the cage includes (A) an entry side that forms an opening for installation and removal of the optical transceiver module and (B) a back side opposite the entry side, and (3) an EMI absorber coupled to the back side of the cage to limit an amount of radiated energy that escapes the cage during operation of the optical transceiver module.

A corresponding method may include (1) creating an EMI absorber that includes a first surface and a second surface that intersect orthogonally to form a right angle with one another and (2) installing the EMI absorber into a cage designed to house an optical transceiver module such that (A) the first surface of the EMI absorber covers a back side of the cage and (B) the second surface of the EMI absorber covers a top side of the cage.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
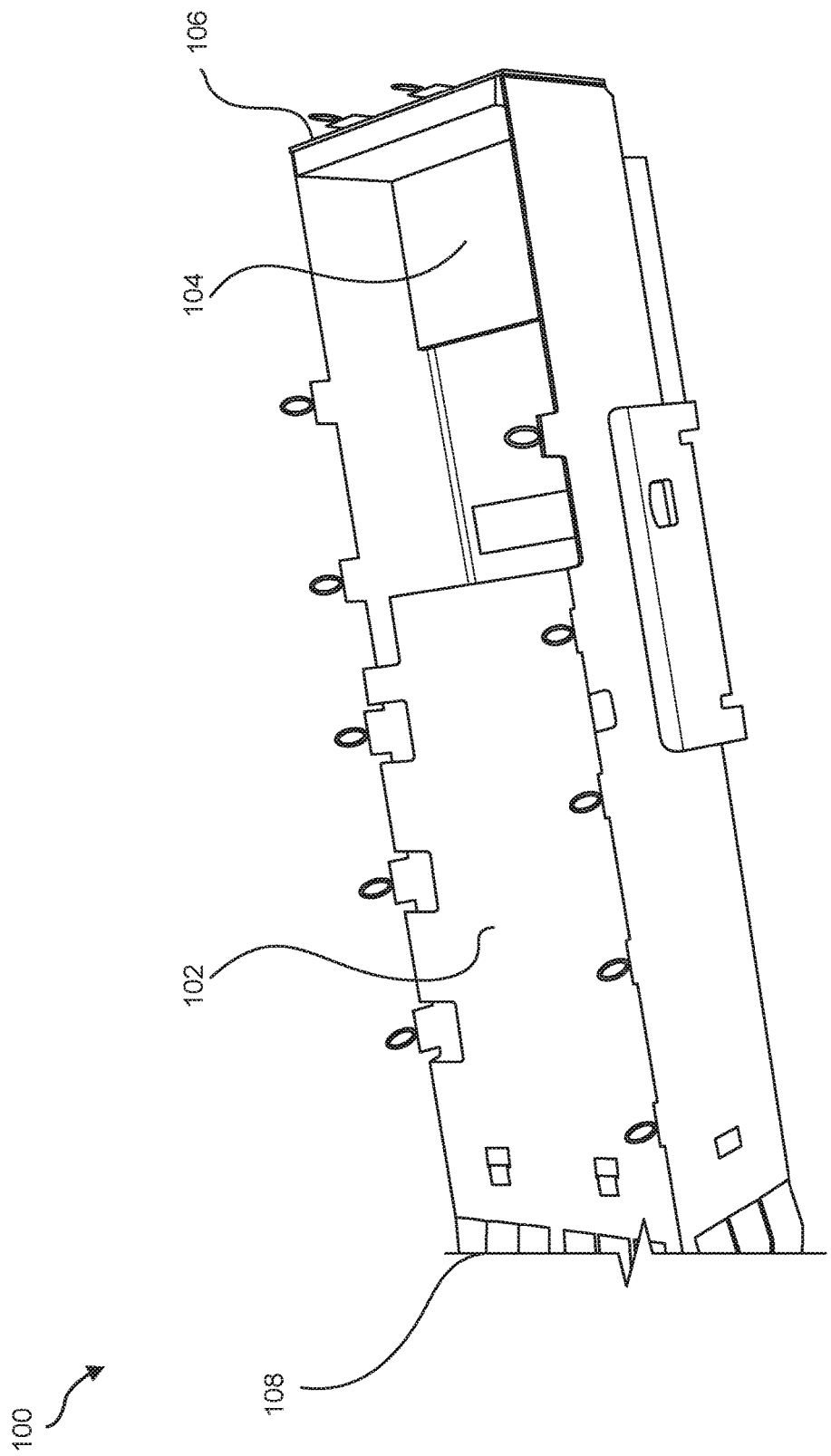
FIG. 1 is an illustration of an exemplary apparatus for EMI mitigation in optical module cages.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for EMI mitigation in optical module cages. As will be explained in greater detail below, embodiments of the instant disclosure may involve coupling and/or applying an EMI absorber to the back side of a cage designed to house an optical transceiver module. This EMI absorber may reduce, decrease, and/or mitigate electromagnetic noise and/or EMI in connection with the operation of the optical transceiver module. For example, the EMI absorber may prevent electromagnetic noise and/or EMI generated by the optical transceiver module from escaping the optical transceiver module's cage and/or interfering with other nearby components and/or devices. Additionally or alternatively, the EMI absorber may prevent electromagnetic noise and/or EMI generated by a nearby component and/or device from penetrating and/or interfering with the optical transceiver module.

The following will provide, with reference to FIG. 1-7, detailed descriptions of an exemplary apparatuses, systems, configurations, and/or implementations for EMI mitigation in optical module cages. In addition, the discussion corresponding to FIG. 8 will provide a detailed description of an exemplary method for EMI mitigation in optical module cages.

FIG. 1 illustrates an exemplary apparatus 100 for EMI mitigation in optical module cages. As illustrated in FIG. 1, exemplary apparatus 100 may include and/or represent a cage 102 and an EMI absorber 104. In one example, EMI absorber 104 may be coupled, secured, and/or applied to a back side 106 of cage 102. Upon doing so, EMI absorber 104 may be able to limit, reduce, and/or mitigate the amount of radiated energy and/or EMI from escaping or penetrating cage 102 during the operation of an optical transceiver module installed into cage 102.

In some examples, cage 102 may include and/or represent a structure, housing, and/or connection mechanism that houses an optical transceiver module in a network device (such as a router and/or switch). In one example, cage 102 may include and/or represent an electromechanical connection interface. In this example, cage 102 may be designed to physically support, accept, and/or receive an optical transceiver module that facilitates communication for a network device. In addition, cage 102 may serve as a form of electromagnetic shielding for the optical transceiver module-though its shielding effectiveness, in the absence of additional electromagnetic shielding, may be imperfect and/or flawed.

Continuing with this example, cage 102 may lock the optical transceiver module into place within the network device. In other words, cage 102 may physically maintain and/or hold the optical transceiver module within the network device. In addition to its mechanical structure and purpose, cage 102 may also serve as an electrical and/or optical interface for the optical transceiver module. For example, cage 102 may effectively connect the optical transceiver module to the network device optically and/or electrically.

Cage 102 may be of various shapes and/or dimensions. In some examples, cage 102 may form a square, a rectangle, and/or a cube. Additional examples of shapes formed by cage 102 include, without limitation, ovals, circles, variations or combinations of one or more of the same, and/or any other suitable shapes.

In some examples, cage 102 may be sized in a particular way to house an optical transceiver module that facilitates communication for the network device. For example, cage 102 may be sized to fit within tight physical dimensions. By doing so, cage 102 and other similar cages may be able to form a row where multiple optical transceiver modules are housed just inside the network device.

Cage 102 may include and/or contain any of a variety of materials. Examples of such materials include, without limitation, metals, plastics, ceramics, polymers, composites, variations or combinations of one or more of the same, and/or any other suitable materials.

In some examples, EMI absorber 104 may include and/or represent a mechanical seal, filler, and/or padding that fills space and/or holes. In one example, EMI absorber 104 may be designed to reduce EMI and/or electromagnetic noise in connection with the operation of the optical transceiver module. In this example, EMI absorber 104 may include and/or represent a form of electromagnetic shielding coupled and/or applied to back side 106 of cage 102, the top side of cage 102, and/or the top-back corner of cage 102. Accordingly, EMI absorber 104 may effectively form a seal between the optical transceiver module and weak and/or vulnerable portions or points of cage 102. In that position, EMI absorber 104 may prevent EMI and/or electromagnetic noise generated by the optical transceiver module from escaping through cage 102. Additionally or alternatively, EMI absorber 104 may prevent EMI and/or electromagnetic noise generated by nearby components and/or devices from penetrating cage 102 toward the optical transceiver module.

In one example, EMI absorber 104 may fill a void and/or air gap formed in cage 102. In other words, in the absence of EMI absorber 104, a void and/or air gap may exist around a certain portion of the optical transceiver module. Alternatively, EMI absorber 104 may reinforce and/or fortify a portion of cage 102 where the optical transceiver emits a relatively high amount of electromagnetic energy. For example, the optical transceiver module may generate and/or emit a high level of electromagnetic energy at and/or near the connector and/or interface within cage 102. In this example, the connector and/or interface may reside and/or sit toward back side 106 of cage 102. Accordingly, EMI absorber 104 may be coupled and/or applied to back side 106 of cage 102, the top side of cage 102, and/or the top-back corner of cage 102.

In some examples, EMI absorber 104 may increase the shielding effectiveness of cage 102. In doing so, EMI absorber 104 may mitigate the potential harm, interference, and/or performance degradation caused by electromagnetic noise from the optical transceiver module and/or nearby components or devices. EMI absorber 104 may also enable the optical transceiver module and/or its corresponding network device to better comply with the regulations implemented by governmental bodies to limit the amount of electromagnetic radiation that such modules are allowed to emit-even as this technology advances and/or its performance continues to improve.

In one example, EMI absorber 104 may be designed and/or tuned to absorb and/or dissipate electromagnetic energy and/or EMI of a specific frequency. For example, EMI absorber 104 may be tuned and/or tailored specifically to electromagnetic energy with a frequency of 25 gigahertz. In another example, EMI absorber 104 may be tuned and/or tailored specifically to electromagnetic energy with a frequency of 50 gigahertz.

EMI absorber 104 may be of various shapes and/or dimensions. In some examples, EMI absorber 104 may form an oval, a square, and/or a rectangle. Additional examples of shapes formed by EMI absorber 104 include, without limitation, circles, cubes, triangles, diamonds, parallelograms, cubes, variations or combinations of one or more of the same, and/or any other suitable shapes.

EMI absorber 104 may include and/or contain a variety of materials. In one example, EMI absorber 104 may be composed of one or more elastomers. Additionally or alternatively, EMI absorber 104 may be composed of one or more lossy materials. Additional examples of materials include, without limitation, rubbers, papers, plastics, silicones, metals, corks, neoprenes, fiberglasses, polytetrafluorethylenes, polymers, combinations or variations of one or more of the same, and/or any other suitable materials.

In one example, EMI absorber 104 may include and/or represent a silicone-based absorber. In another example, EMI absorber 104 may include and/or represent a fabric-over-foam gasket. In a further example, EMI absorber 104 may include and/or represent a conductive gasket. In an additional example, EMI absorber 104 may include and/or represent a finger stock gasket.

EMI absorber 104 may have and/or exhibit various qualities and/or properties conducive to EMI mitigation. As a specific example, EMI absorber 104 may have a frequency range of greater than or equal to 6 gigahertz, a maximum service temperature of 170 degrees Celsius, a Shore hardness of greater than 70, an elongation of 50%, a tensile strength of 5.0 megapascals, a volume resistivity of $2 \times 10^8$ ohms per centimeter, and/or a dielectric strength of greater than 10 volts per mil.

In some examples, EMI absorber 104 may contribute to reducing an amount of radiated energy that escapes and/or penetrates through the weak, vulnerable, and/or susceptible points and/or spots of cage 102. For example, EMI absorber 104 may convert at least a portion of the radiated energy produced by the optical transceiver module to heat. Additionally or alternatively, EMI absorber 104 may conduct at least a portion of the radiated energy produced by the optical transceiver module. In one example, EMI absorber 104 may contribute to limiting the amount of radiated energy that escapes via cage 102 to less than −15 decibels relative to the governmental class A regulatory limit.

As illustrated in FIG. 1, cage 102 may include an entry side 108 that forms an opening for installation and removal of the optical transceiver module. In addition, cage 102 may include back side 106 that is positioned and/or situated opposite entry side 108. FIG. 1 may illustrate cage 102 from an inverted perspective and/or view as the bottom side of cage 102 is positioned and/or shown toward the top and the top side of cage 102 is positioned and/or shown toward the bottom. For example, EMI absorber 104 in FIG. 1 may be coupled and/or applied to both back side 106 of cage 102 and the top side of cage 102, which is shown toward the bottom of FIG. 1.

Figure 2:
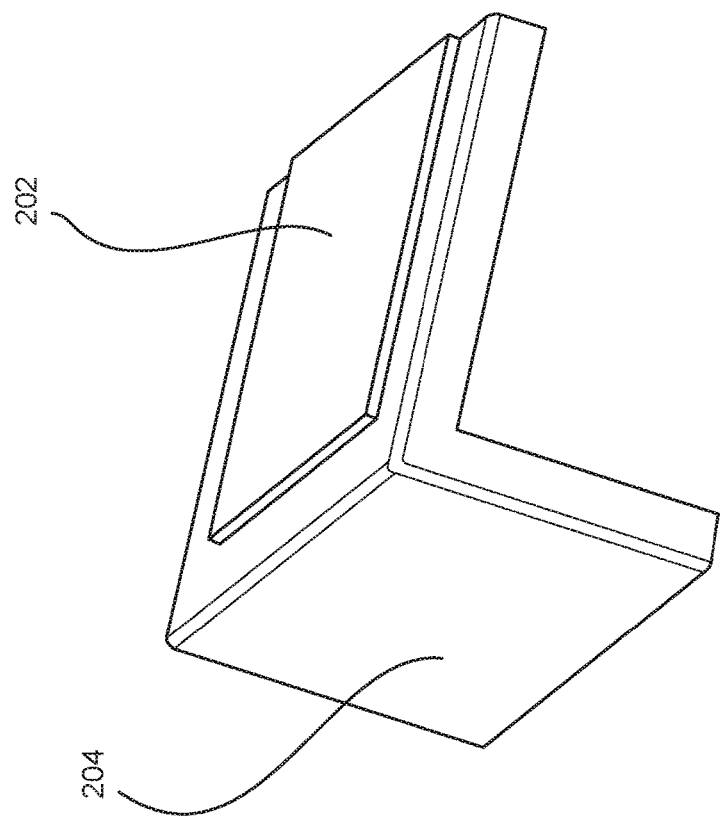
FIG. 2 is an illustration of an exemplary EMI absorber that facilitates EMI mitigation in optical module cages.
Figure 2:
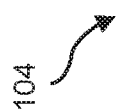

FIG. 2 illustrates an exemplary perspective and/or view of EMI absorber 104. As illustrated in FIG. 2, EMI absorber 104 may include and/or represent a surface 202 and a surface 204. In one example, surfaces 202 and 204 may intersect orthogonally or perpendicularly to form a right angle with one another. In this example, surfaces 202 and 204 may be designed and/or sized to fit in the top-back corner of cage 102. Additionally or alternatively, surfaces 202 and 204 may be designed and/or sized to cover or block the greatest possible surface area over back side 106 of cage 102 and/or the top side of cage 102.

In some examples, surface 202 and/or surface 204 may be equipped and/or furnished with an adhesive intended to secure EMI absorber 104 in place relative to cage 102. For example, surface 202 may be equipped and/or furnished with an adhesive that secures surface 202 to the top side of cage 102. In this example, surface 204 may be equipped and/or furnished with an adhesive that secures surface 204 to back side 106 of cage 102. Examples of such adhesives include, without limitation, glue, cement, mortar, putty, solder, tape, combinations or variations of one or more of the same, and/or any other suitable adhesives.

In one example, EMI absorber 104 may include and/or represent a single molded piece and/or part. In this example, the single molded piece and/or part may include and/or represent surfaces 202 and 204. Additionally or alternatively, EMI absorber 104 may include and/or represent a plurality of die-cut pieces and/or parts. For example, EMI absorber 104 may include and/or represent one die-cut piece of EMI material that interfaces with the back side of cage 102 and/or another die-cut piece of EMI material that interfaces with the top side of cage 102.

Figure 3:
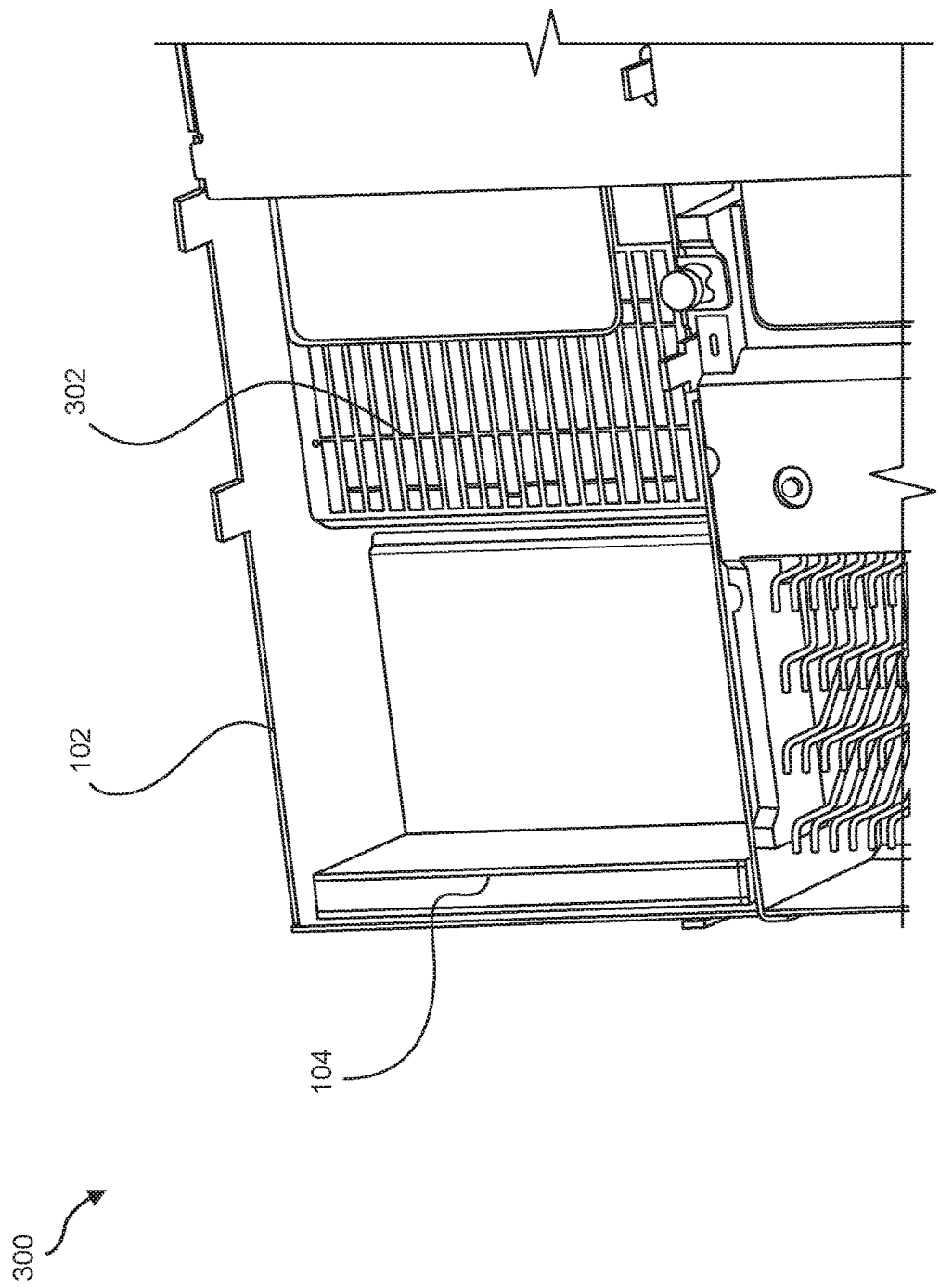
FIG. 3 is an illustration of an additional exemplary apparatus for EMI mitigation in optical module cages.

FIG. 3 illustrates an exemplary apparatus 300 for EMI mitigation in optical module cages. As illustrated in FIG. 3, exemplary apparatus 300 may include and/or represent cage 102, EMI absorber 104, and a connector 302. In one example, EMI absorber 104 may be coupled, secured, and/or applied to the back side of cage 102 and the top side of cage 102. Accordingly, EMI absorber 104 may cover and/or block the top-back corner of cage 102. As a result, EMI absorber 104 may be able to limit, reduce, and/or mitigate the amount of radiated energy and/or EMI from escaping or penetrating cage 102 during the operation of an optical transceiver module installed into cage 102.

As illustrated in FIG. 3, connector 302 may reside and/or sit inside cage 102. In one example, connector 302 may facilitate electrically and/or physically coupling the optical transceiver module to a network device that includes cage 102. For example, as the optical transceiver module is installed in cage 102, one side of connector 302 may enter cage 102 and then interface with connector 302. In this example, upon installation, the optical transceiver module may facilitate handling and/or forwarding traffic passing through the network device.

EMI absorber 104 may be placed and/or positioned internal or external to cage 102. As illustrated in FIG. 3, EMI absorber 104 may cover and/or extend across all the back side internal to cage 102. In this example, EMI absorber 104 may cover and/or extend across only a portion of the top side internal to cage 102. EMI absorber 104 may interface with the back side and/or top side inside cage 102.

Additionally or alternatively, EMI absorber 104 may cover and/or extend across all the back side external to cage 102. In this example, EMI absorber 104 may cover and/or extend across only a portion of the top side external to cage 102. EMI absorber 104 may interface with the back side and/or top side outside cage 102.

Figure 4:
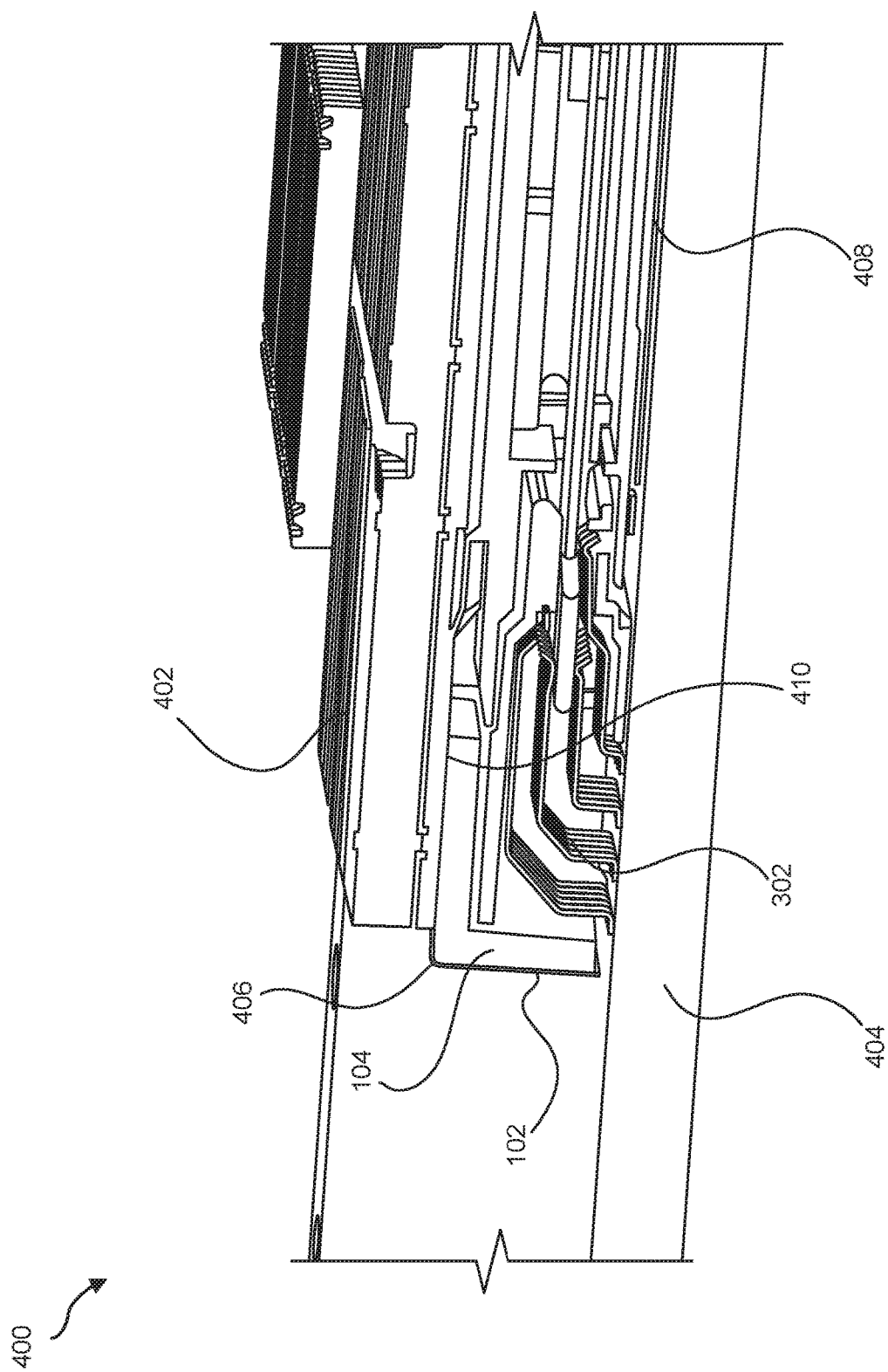
FIG. 4 is an illustration of an exemplary system for EMI mitigation in optical module cages.

FIG. 4 illustrates an exemplary system 400 for EMI mitigation in optical module cages. As illustrated in FIG. 4, exemplary system 400 may include and/or represent cage 102, EMI absorber 104, connector 302, a heatsink 402, and a circuit board 404. In one example, cage 102 may include and/or incorporate a top-back corner 406 that forms an intersection between the back side of cage 102 and a top side 410 of cage 102. In this example, EMI absorber 104 may cover and/or block top-back corner 406.

As illustrated in FIG. 4, cage 102 may include a bottom side 408 coupled and/or secured to circuit board 404 of a network device. In this example, bottom side 408 may be positioned and/or situated opposite top side 410. Cage 102 may form and/or provide a slot and/or receptacle for an optical transceiver module, and bottom side 408 and top side 410 of cage 102 may be positioned and/or situated on opposite sides of the slot and/or receptacle relative to one another. In one example, EMI absorber 104 may be coupled and/or applied to the back side of cage 102 and/or top side 410 of cage 102.

As illustrated in FIG. 4, heatsink 402 may be physically and/or thermally coupled to top side 410 of cage 102. In one example, heatsink 402 may include and/or represent any type or form of device, structure, and/or mechanism designed to conduct, transfer, absorb, and/or sink heat. Heatsink 402 may include and/or contain a variety of thermally conductive materials. Examples of such thermally conductive materials include, without limitation, copper, aluminum, diamond, alloys of one or more of the same, combinations or variations of one or more of the same, and/or any other suitable materials.

Figure 5:
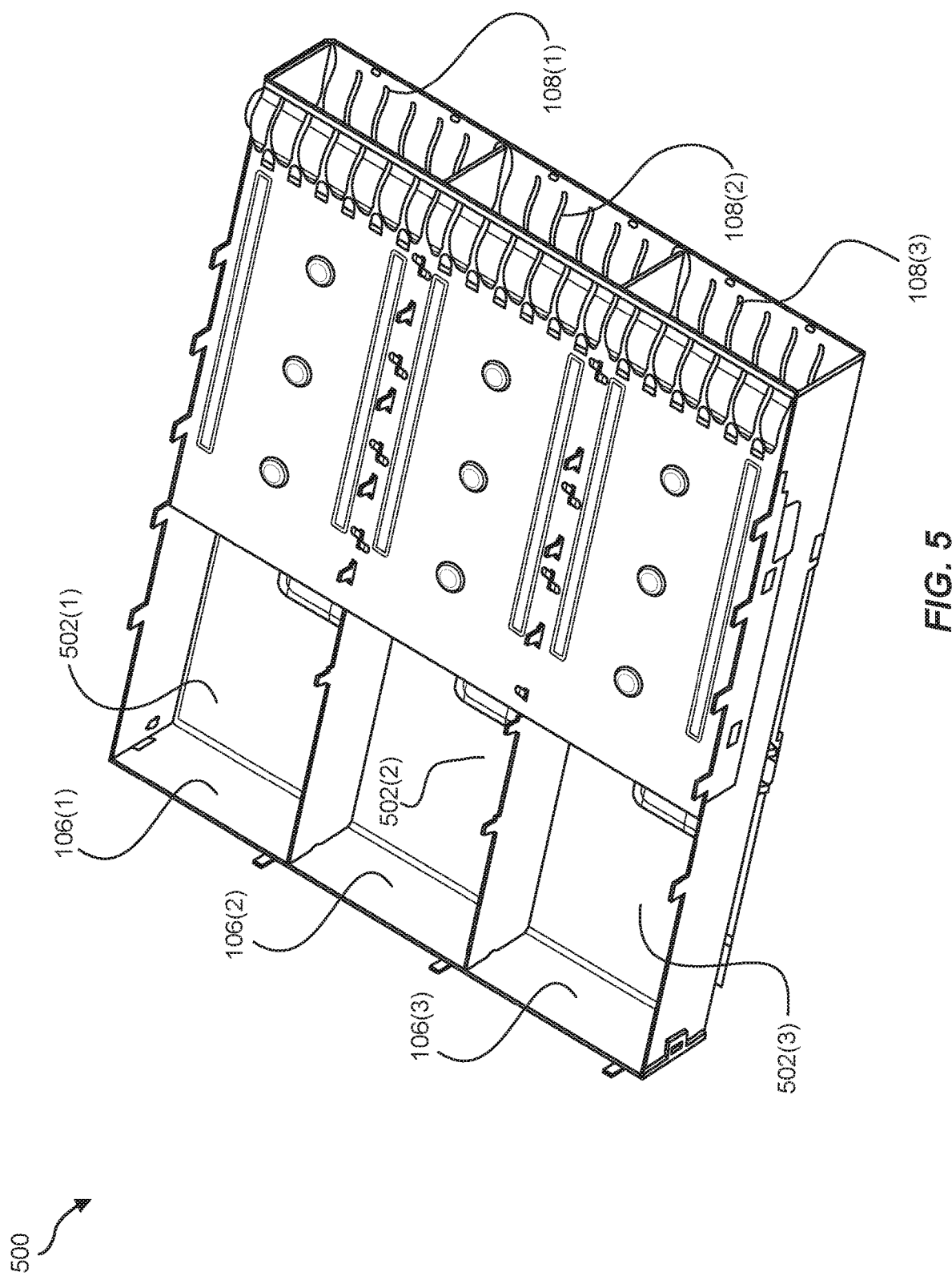
FIG. 5 is an illustration of an exemplary cage for housing multiple optical transceiver modules.

FIG. 5 illustrates an exemplary cage 500 for EMI mitigation in optical module cages. As illustrated in FIG. 5, exemplary cage 500 may include and/or form a plurality of slots 502(1), 502(2), and 502(3) fitted to accept and/or house optical transceiver modules. In one example, such optical transceiver modules may enter slots 502(1)-(3) of cage 500 via entry sides 108(1), 108(2), and 108(3), respectively. In this example, entry sides 108(1)-(3) may be positioned and/or situated opposite back sides 106(1), 106(2), and 106(3), respectively.

Figure 6:
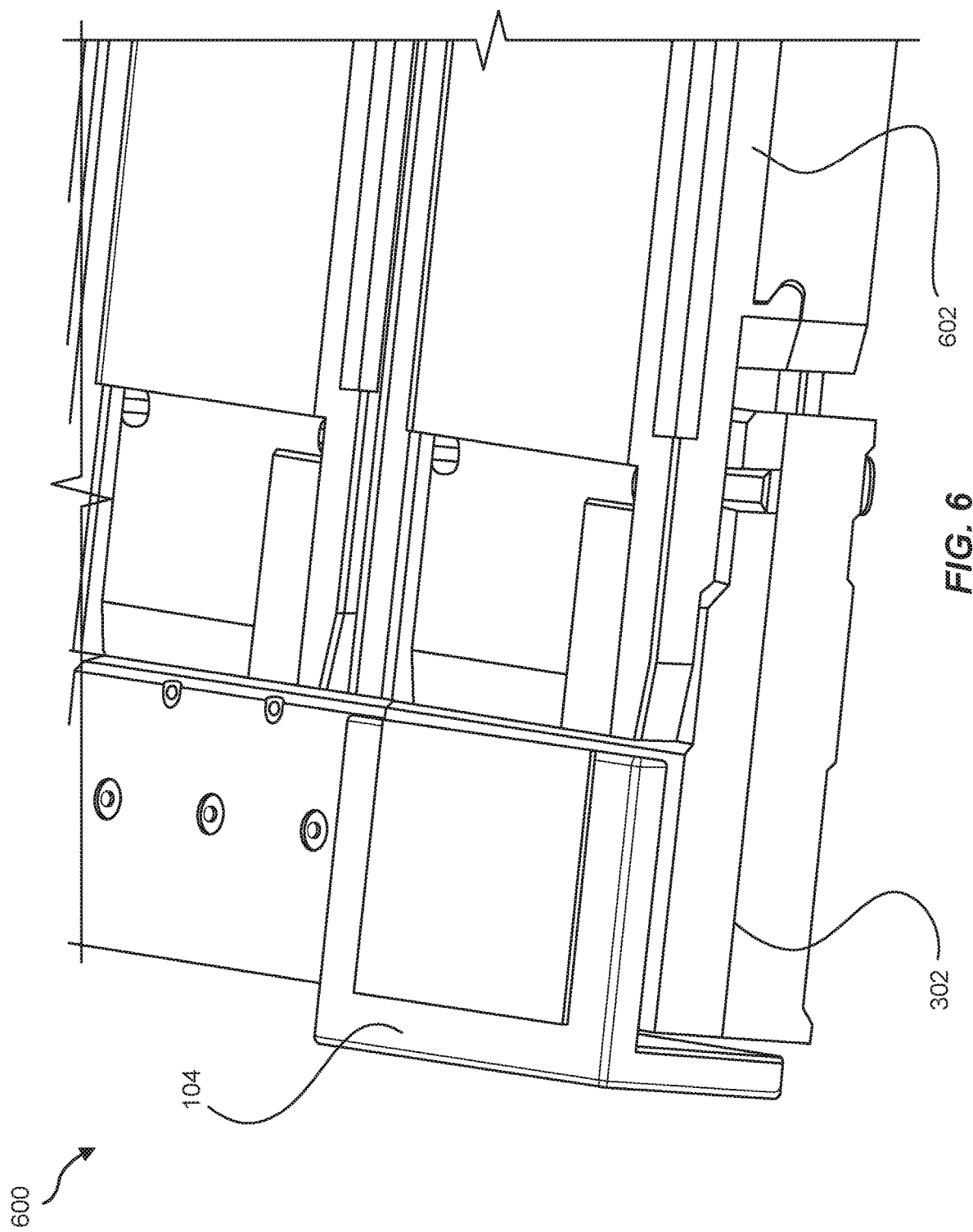
FIG. 6 is an illustration of an additional exemplary system for EMI mitigation in optical module cages.

FIG. 6 illustrates an exemplary system 600 for EMI mitigation in optical module cages. In FIG. 6, cage 102 may be excluded from view to show the positioning and/or application of other relevant components. As illustrated in FIG. 6, exemplary system 600 may include and/or represent EMI absorber 104, connector 302, and an optical transceiver module 602. In one example, optical transceiver module 602 may be formed in a Small Form-Factor (SFP) pluggable package and/or Quad SFP (QSFP) pluggable package. For example, optical transceiver module 602 may include and/or represent a QSFP Double Density (DD) module, such as a QSFP-DD 400G module.

Additionally or alternatively, optical transceiver module 602 may include and/or represent a Type 1, Type 2, and/or Type 3 QSFP module, as defined by the QSFP-DD Multi-Source Agreement (MSA). In one example, optical transceiver module 602 may support SONET, GIGABIT ETHERNET, FIBRE CHANNEL, and/or other communications standards. In this example, optical transceiver module 602 may be communicatively coupled to other computing devices via a fiber optic, copper, and/or other network cable. In this way, optical transceiver module 602 may enable a network device to communicate with such devices within the same network and/or across multiple networks.

In one example, EMI absorber 104 may be shaped and/or contoured to fit or hug connector 302. In this example, optical transceiver module 602 may be installed and/or inserted into cage 102 (not illustrated in FIG. 6). When installed and/or inserted into cage 102, optical transceiver module 602 may interface with and/or be attached to connector 302.

Figure 7:
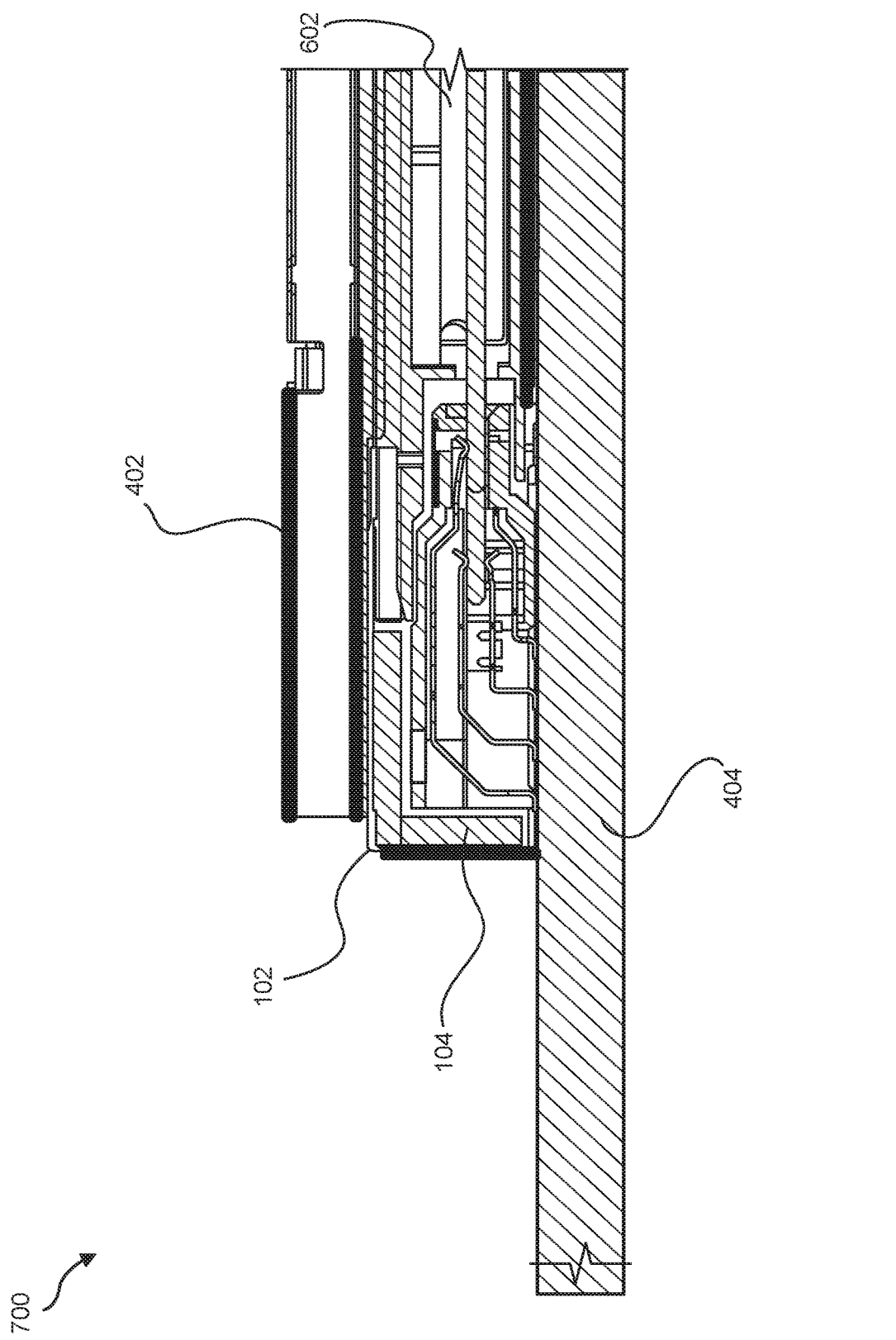
FIG. 7 is an illustration of an additional exemplary system for EMI mitigation in optical module cages.

FIG. 7 illustrates an exemplary system 700 for EMI mitigation in optical module cages. As illustrated in FIG. 7, exemplary system 700 may include and/or represent cage 102, EMI absorber 104, heatsink 402, circuit board 404, and optical transceiver module 602. In one example, cage 102 may be coupled and/or secured to circuit board 404. In this example, heatsink 402 may be coupled and/or secured externally to the top side of cage 102.

In one example, EMI absorber 104 may be coupled and/or applied internally to the back side and top side of cage 102. In this example, optical transceiver module 602 may be installed and/or inserted into cage 102. EMI absorber 104 may effectively form a seal and/or barrier between optical transceiver module 602 and cage 102, thereby preventing EMI and/or electromagnetic noise generated by optical transceiver module 602 from escaping cage 102 and/or preventing EMI and/or electromagnetic noise generated by nearby components and/or devices from penetrating cage 102.

Figure 8:
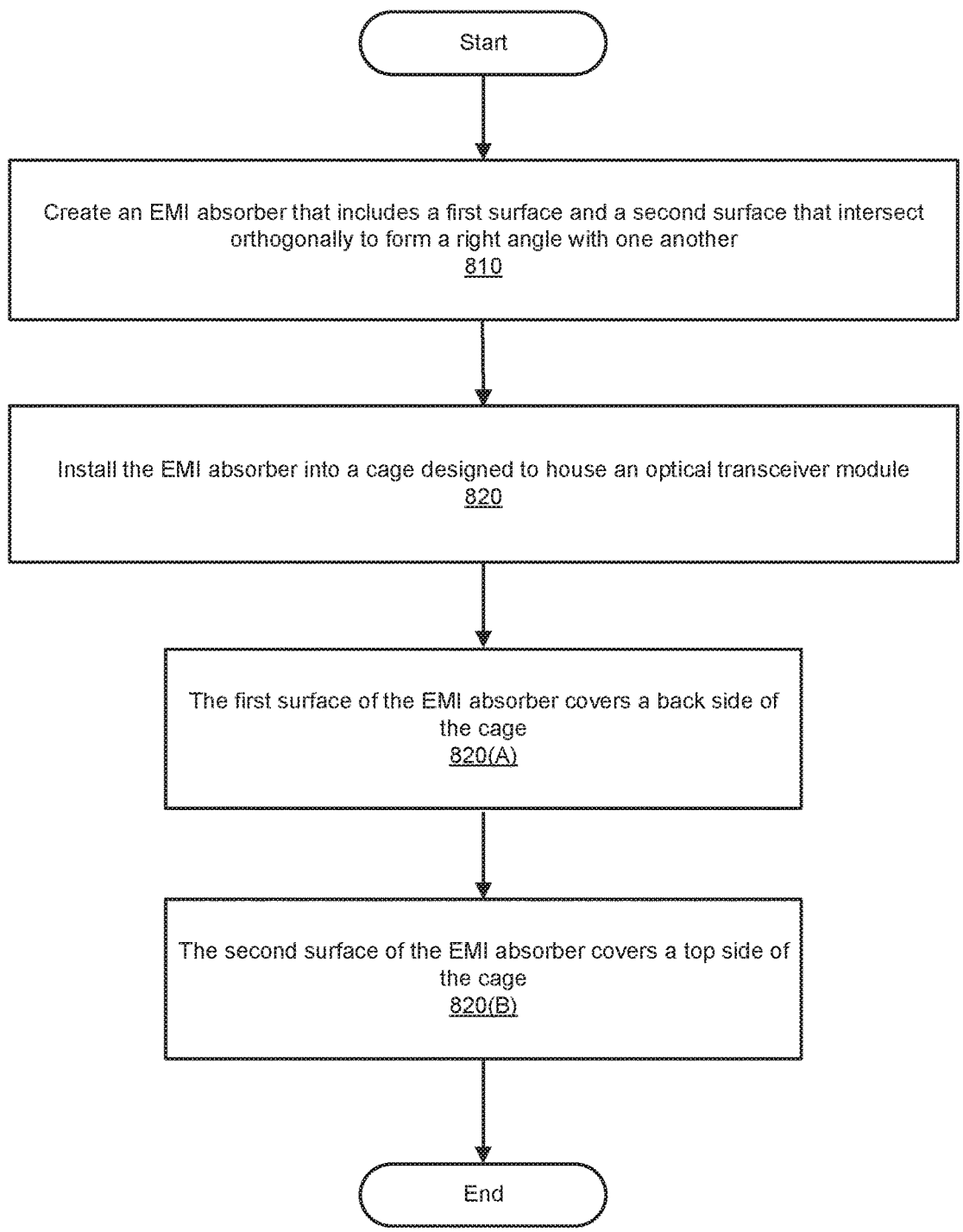
FIG. 8 is a flow diagram of an exemplary method for EMI mitigation in optical module cages.

FIG. 8 is a flow diagram of an exemplary method 800 for EMI mitigation in optical module cages. Method 800 may include the step of creating an EMI absorber that includes a first surface and a second surface that intersect orthogonally to form a right angle with one another (810). Step 810 may be performed in a variety of ways, including any of those described above in connection with FIGS. 1-7. For example, a computing equipment manufacturer or subcontractor may create an EMI absorber that includes a first surface and a second surface that intersect orthogonally to form a right angle with one another. In one example, the EMI absorber may include and/or represent a single molded piece and/or part. In another example, the EMI absorber may include and/or represent two separate die-cut pieces of EMI material joined together.

Method 800 may also include the step of installing the EMI absorber into a cage designed to house an optical transceiver module (820). Step 820 may be performed in a variety of ways, including any of those described above in connection with FIGS. 1-7. For example, the computing equipment manufacturer or subcontractor may install the EMI absorber into a cage that houses and/or accepts the optical transceiver module. Upon doing so, the first surface of the EMI absorber may cover a back side of the cage (820(A)), and/or the second surface of the EMI absorber may cover a top side of the cage (820(B)).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. An apparatus comprising:
  a cage designed to house an optical transceiver module, wherein the cage includes:
    an entry side that forms an opening for installation and removal of the optical transceiver module;
    a back side opposite the entry side;
    a bottom side coupled to a circuit board;
    a top side opposite the bottom side; and
    a top-back corner that forms an intersection between the back side of the cage and the top side of the cage; and
  a non-metal Electromagnetic Interference (EMI) absorber coupled to the back side of the cage and the top side of the cage, wherein the non-metal EMI absorber:

includes a first die-cut piece of EMI material and a second die-cut piece of EMI material that intersect orthogonally to form a right angle with one another, wherein the first die-cut piece of EMI material interfaces with the back side of the cage and the second die-cut piece of EMI material interfaces with the top side of the cage;

covers and fits in the top-back corner of the cage; and limits an amount of radiated energy from escaping the cage during operation of the optical transceiver module.

2. The apparatus of claim 1, wherein the non-metal EMI absorber is coupled to the back side inside the cage.

3. The apparatus of claim 1, wherein the non-metal EMI absorber is coupled to the back side outside the cage.

4. The apparatus of claim 1, wherein the non-metal EMI absorber:

covers all the back side internal to the cage; and covers a portion of the top side internal to the cage.

5. The apparatus of claim 1, wherein the non-metal EMI absorber comprises at least one of:

a silicone-based absorber; and an elastomer-based absorber.

6. A system comprising:

a circuit board;

a cage designed to house an optical transceiver module, wherein the cage includes:

an entry side that forms an opening for installation and removal of the optical transceiver module;

a back side opposite the entry side;

a bottom side coupled to the circuit board;

a top side opposite the bottom side; and a top-back corner that forms an intersection between the back side of the cage and the top side of the cage; and a non-metal Electromagnetic Interference (EMI) absorber coupled to the back side of the cage and the top side of the cage, wherein the non-metal EMI absorber:

includes a first die-cut piece of EMI material and a second die-cut piece of EMI material that intersect orthogonally to form a right angle with one another, wherein the first die-cut piece of EMI material interfaces with the back side of the cage and the second die-cut piece of EMI material interfaces with the top side of the cage;

covers and fits in the top-back corner of the cage; and limits an amount of radiated energy from escaping the cage during operation of the optical transceiver module.

7. The system of claim 6, wherein the non-metal EMI absorber is coupled to the back side inside the cage.

8. The system of claim 6, wherein the non-metal EMI absorber is coupled to the back side outside the cage.

9. The system of claim 6, wherein the non-metal EMI absorber:

covers all the back side internal to the cage; and covers a portion of the top side internal to the cage.

10. A method comprising:

creating a non-metal Electromagnetic Interference (EMI) absorber that includes a first die-cut piece of EMI material and a second die-cut piece of EMI material that intersect orthogonally to form a right angle with one another; and installing the non-metal EMI absorber into a cage designed to house an optical transceiver module, wherein:

the cage includes:

an entry side that forms an opening for installation and removal of the optical transceiver module;

a back side opposite the entry side;

a bottom side coupled to a circuit board;

a top side opposite the bottom side; and a top-back corner that forms an intersection between the back side of the cage and the top side of the cage; and the non-metal EMI absorber is installed such that:

the first die-cut piece of EMI material covers and is coupled to the back side of the cage;

the second die-cut piece of EMI material covers and is coupled to the top side of the cage;

the non-metal EMI absorber covers and fits in the top-back corner of the cage; and the non-metal EMI absorber limits an amount of radiated energy from escaping the cage during operation of the optical transceiver module.

\* \* \* \* \*